United States Patent [19]

Vaeches

[11] 4,280,220
[45] Jul. 21, 1981

[54] ELECTRONIC TESTING SYSTEM

[75] Inventor: Theodore A. Vaeches, San Jose, Calif.

[73] Assignee: Fairchild Camera & Instrument Corp., Mountain View, Calif.

[21] Appl. No.: 75,916

[22] Filed: Sep. 17, 1979

[51] Int. Cl.³ .............................................. G06F 11/00
[52] U.S. Cl. .................................. 371/27; 324/73 R; 364/580
[58] Field of Search .................... 371/15, 20, 24–27; 364/580; 324/73 R, 73 AT

[56] References Cited

U.S. PATENT DOCUMENTS

| | | | |
|---|---|---|---|
| 3,787,669 | 1/1974 | Muehldorf | 364/580 X |
| 3,849,726 | 11/1974 | Justice | 324/73 R |
| 4,013,951 | 3/1977 | Ezoe et al. | 371/27 X |
| 4,139,147 | 2/1979 | Franke | 324/73 R X |

*Primary Examiner*—Jerry Smith
*Attorney, Agent, or Firm*—Paul J. Winters; Ronald J. Meetin; Michael J. Pollock

[57] ABSTRACT

An electronic system for testing an electronic device responsive to a data clock signal and to a serial input data signal synchronous with the data clock signal comprises an oscillator for generating oscillator pulses, a data clock signal generator responsive to oscillator pulses for generating the data clock signal, timing circuitry for counting oscillator pulses and for generating at least one input select signal indicative of the number of oscillator pulses counted, and multiplexing circuitry for receiving at least two parallel input data signals and for sequentially selecting the parallel input data signals in response to the input select signal or signals to generate the serial input data signal.

9 Claims, 7 Drawing Figures

ELECTRONIC TESTING SYSTEM

BACKGROUND OF THE INVENTION

1. Field of the Invention

This invention relates generally to electronic systems for testing electronic devices and more particularly to electronic systems which convert parallel input data signals into serial input data signals for testing electronic devices responsive to serial input data signals.

2. Summary of the Invention

In accordance with the present invention, an electronic system for testing an electronic device responsive to a serial input data signal comprises an oscillator for repetitively generating oscillator pulses at a selected repetition period, timing circuitry for counting oscillator pulses and for generating one or more input select signals indicative of the number or numbers of oscillator pulses counted, and multiplexing circuitry for receiving two or more parallel input data signals and for sequentially selecting each of the parallel input data signals in response to the input select signal or signals to generate the serial input data signal. The electronic device under test accepts the serial input data signal when it is synchronous with a data clock signal produced by a data clock signal generator responsive to oscillator pulses.

Preferably, the electronic testing system includes a data clock signal inhibitor for inhibiting the data clock signal after the multiplexing circuitry has selected each of the parallel input data signals a specified number of times so that the device under test no longer accepts the serial input data signal. The data clock signal inhibitor inhibits the data clock signal in response to one or more timing signals produced by the timing circuitry after it has counted a selected number of oscillator pulses.

The testing system may also include circuitry for generating a signal to initiate an auxiliary function further required for evaluating the device under test. The auxiliary function signal is generated in response to one or more timing signals produced by the timing circuitry after it has counted another selected number of oscillator pulses.

To start a new testing sequence, the various components of the testing system are initialized, as necessary, in response to initializing signals. Preferably, initializing signal circuitry generates the initializing signals in response to one or more timing signals produced by the timing circuitry after it has counted a selected number of oscillator pulses.

BRIEF DESCRIPTION OF THE DRAWINGS

Like reference symbols are employed in the drawings to represent the same item or items in the drawings and in the description of the preferred embodiments.

DESCRIPTION OF THE PREFERRED EMBODIMENTS

In describing the preferred embodiments, the following notational system is utilized. "C", "D", "R", and "T" as the first character of a reference symbol indicate that the referenced item is a capacitor, diode, resistor, or transistor, respectively. Similarly, "S" as the first character of a reference symbol indicates that the referenced item is a signal. A line carrying a signal is generally referenced with the same symbol as the signal except that the "S" is omitted. In the drawings illustrating block diagrams, the transmission paths for selected signals are shown as arrows labeled with the symbols for the corresponding signals.

Figure 1:
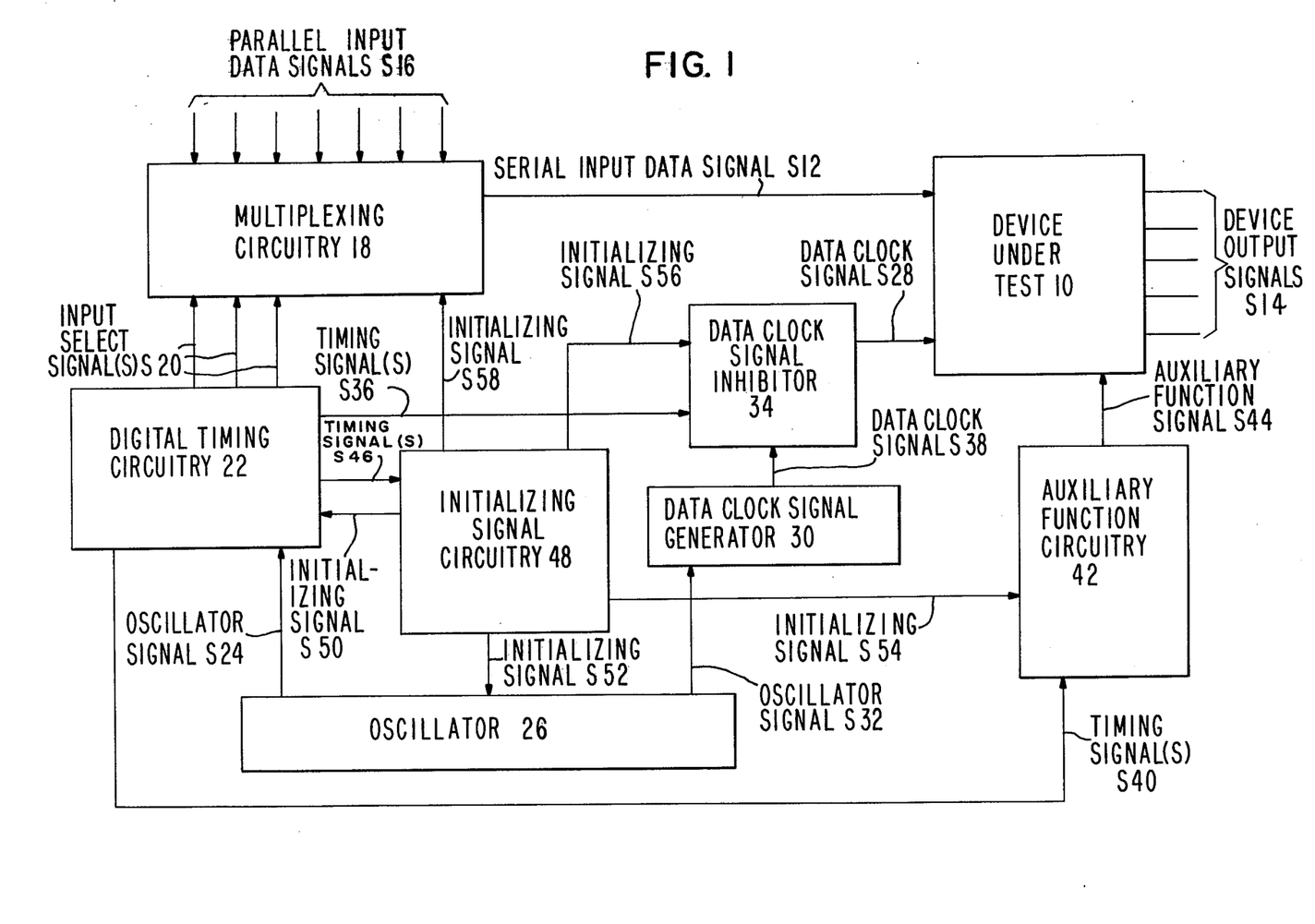
FIG. 1 is a block diagram of an electronic testing system in accordance with the present invention.

FIG. 1 shows a block diagram of an electronic system for testing and evaluating an electronic device 10. Responsive to a serial input data signal S12, device under test 10 (hereafter usually referred to as DUT 10), produces one or more device output signals S14. Output signals S14 are monitored by an external system (which is not shown) for evaluating the performance of DUT 10. The present testing system receives two or more parallel input data signals S16 and converts them into serial input data signal S12 for testing DUT 10.

Each of parallel input data signals S16 is of an amplitude that does not vary substantially with time during a testing sequence. The amplitude of the particular signal parameter, such as voltage, which forms each parallel input data signal S16 is selected from two or more amplitude levels. Serial input data signal S12 comprises a series of amplitude levels representing the amplitude of each of parallel input data signals S16 arranged sequentially in time.

Except for signals S12 and S16 which each comprise one or more amplitude levels, each other signal produced in the testing system generally consists of one or more changes in amplitude level of the particular signal parameter such as voltage. Often the changes in amplitude level defining each other signal comprise one or more pulses which may be either positive going or negative going.

As shown in FIG. 1, multiplexing circuitry 18 receives parallel input data signals S16. Responsive to one or more input select signals S20, multiplexing circuitry 18 sequentially selects each of parallel input data signals S16 and combines the selected signal portions in time to produce serial input data signal S12.

Digital timing circuitry 22 produces input select signal(s) S20 in response to an oscillator signal S24 from an oscillator 26. Oscillator signal S24 comprises a series of pulses produced at a selected repetition period. Each input select signal S20 consists of one or more pulses. Each pulse of each input select signal S20 is generally produced when a selected number of oscillator pulses are counted by timing circuitry 22.

DUT 10 accepts serial input data signal S12 when it is "synchronous" with a data clock signal S28. Data clock signal S28 consists of a series of data clock pulses at a selected repetition period. The term "synchronous" as used herein means that the data clock pulses of data clock signal S28 are received at DUT 10 substantially coincident in time with the reception of serial input data signal S12. During the time periods between data clock pulses or during a time period when no data clock pulses of data clock signal S28 are received by DUT 10, serial input data signal S12 is not synchronous with data clock signal S28.

The data clock pulses forming data clock signal S28 originate from a data clock signal generator 30 which acts in response to an oscillator signal S32 from oscillator 26. Oscillator signal S32 comprises a series of oscillator pulses at a selected repetition period. The oscillator pulses received by data clock signal generator 30 may be the same as the oscillator pulses which feed into timing circuitry 22 or may be differently operated upon before leaving oscillator 26.

A data clock signal inhibitor 34 coupled between data clock signal generator 30 and DUT 10 prevents the data clock pulses from being transmitted to DUT 10 after a specified time. Data clock signal inhibitor 34 so inhibits the data clock pulses in response to one or more timing signals S36 from digital timing circuitry 22. Timing signal(s) S36 is (are) generated when timing circuitry 22 has counted a predetermined number of oscillator pulses. This occurs after multiplexing circuitry 18 has selected each of parallel input data signals S16 a specified number of times.

The data clock signal directly produced by data clock signal generator 30 is represented as a data clock signal S38 in FIG. 1, while the data clock signal resulting after passage through data clock signal inhibitor 34 is data clock signal S28. Data clock signal S38 comprises a series of data clock pulses whose number extends in time beyond those of data clock signal S28.

Whereas data clock signal inhibitor 34 has been described as a separate component from data clock signal generator 30, the two components could also comprise a single data clock generator which ceases to produce data clock pulses after a specified time. In this case, data clock signal S38 would not exist.

Responsive to one or more timing signals S40 from digital timing circuitry 22, auxiliary function circuitry 42 generates an auxiliary function signal S44 which is transmitted to DUT 10 for further assistance in evaluating DUT 10. Timing signal(s) S40 is (are) generated when timing circuitry 22 has counted a specified number of oscillator pulses. Although auxiliary function circuitry 42 has been described as producing only auxiliary function signal S44, auxiliary function circuitry 42 may also produce one or more additional auxiliary function signals for use in testing DUT 10.

In response to one or more timing signals S46 from digital timing circuitry 22 after it has counted a selected number of oscillator pulses, initializing signal circuitry 48 generates signals to initialize the various testing system components, as necessary, to place the testing system in a state for beginning a new testing sequence. As shown in FIG. 1, initializing signal circuitry 48 generates initializing signals S50, S52, and S54 to return timing circuitry 22, oscillator 26, and auxiliary function circuitry 42, respectively, to initial status. An initializing signal S56 from initializing signal circuitry 48 causes data clock signal inhibitor 34 to stop inhibiting data clock pulses. Where multiplexing circuitry 18 has been disabled prior to the end of the current testing sequence, an initializing signal S58 from initializing signal circuitry 48 reenables multiplexing circuitry 18 to place it in a condition for accepting new parallel input data.

Figure 2A:
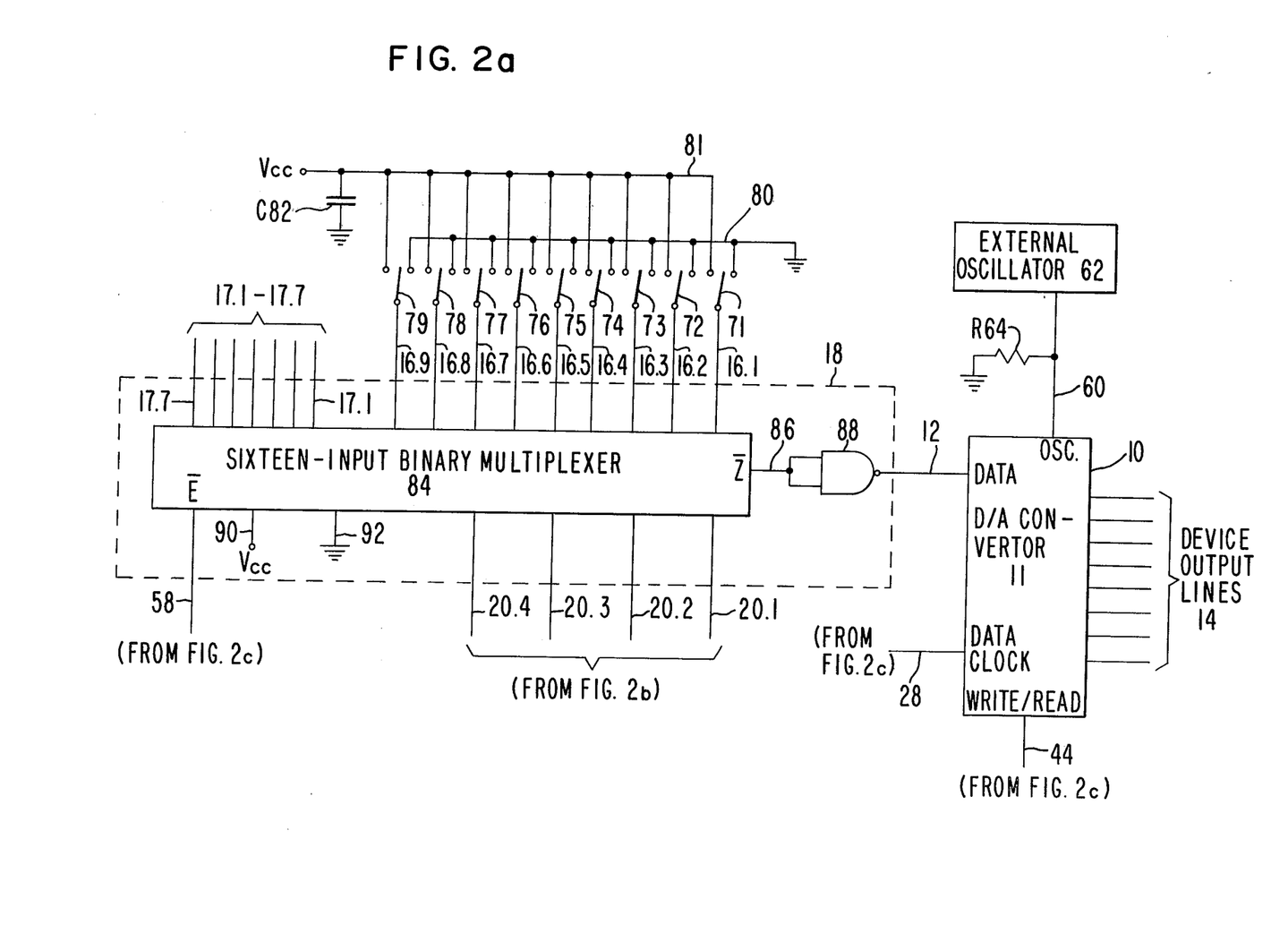
FIGS. 2a, 2b, and 2c are circuit and block diagrams for the components of an embodiment of the testing system of FIG. 1.
Figure 2B:
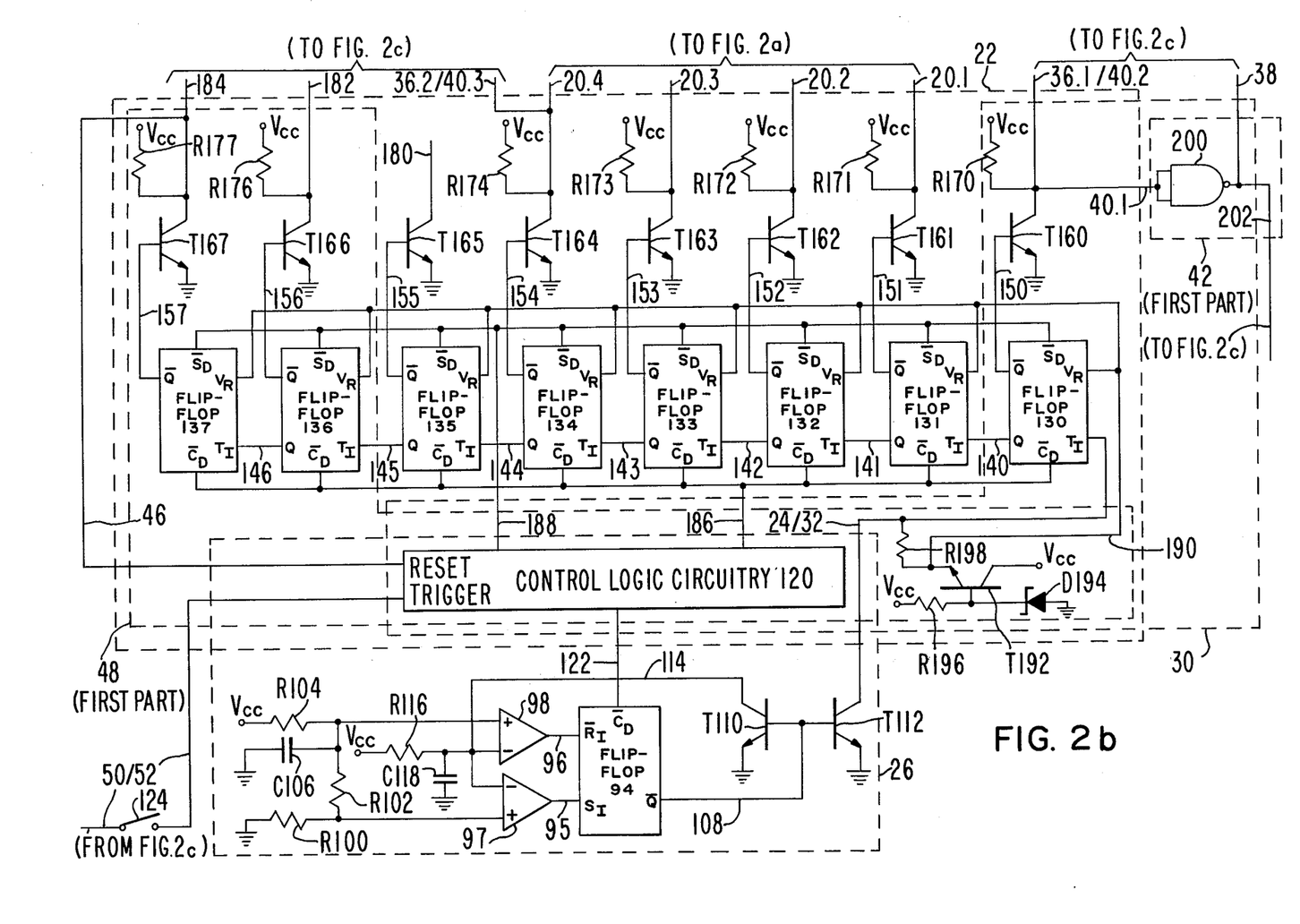
Figure 2C:
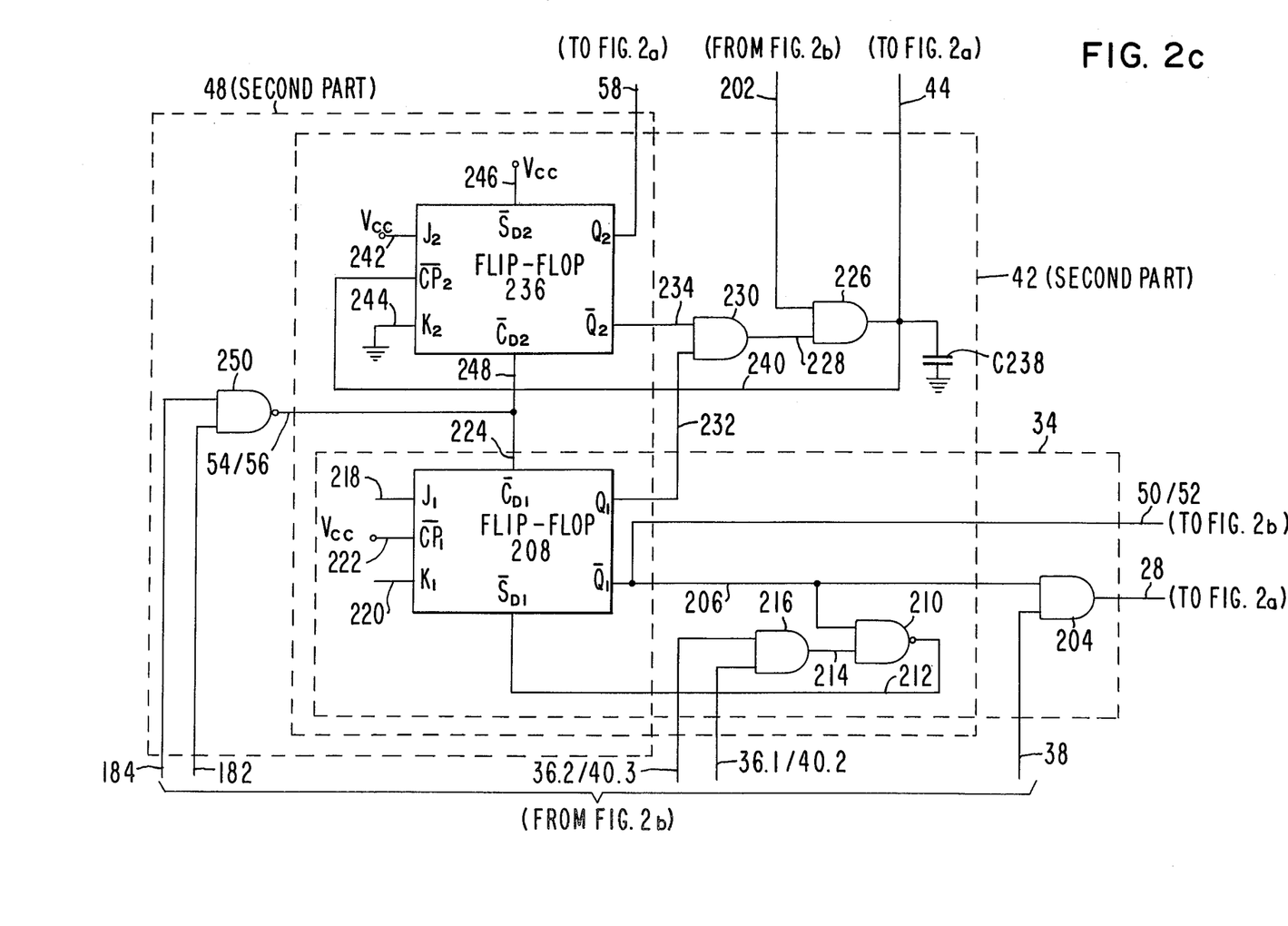

FIGS. 2a, 2b, and 2c illustrate circuit and block diagrams for a specific embodiment of the testing system and, in particular, for specific embodiments of multiplexing circuitry 18, digital timing circuitry 22, oscillator 26, data clock signal generator 30, data clock signal inhibitor 34, auxiliary function circuitry 42, and initializing signal circuitry 48. Auxiliary function circuitry 42 and initializing signal circuitry 48 are each shown in two parts, one part being in FIG. 2b and the other part being in FIG. 2c. The various components 18, 22, 26, 30, 34, 42, and 48 of the testing system contain many elements common to one another as indicated by the dotted lines in FIGS. 2a, 2b, and 2c delineating the components.

In describing the operation of the specific embodiment depicted in FIGS. 2a, 2b, and 2c, a binary low voltage or a binary low logic level will normally be referred to simply as a binary "0", while a binary high voltage or a binary high logic level will normally be referred to simply as a binary "1".

In this specific embodiment of the testing system, DUT 10 is a digital-to-analog (D/A) converter 11 which receives serial input data signal S12 on a line 12 at a DATA input terminal as depicted in FIG. 2a. D/A converter 11 accepts the data on serial input data signal S12 when it is synchronous with data clock signal S28 on a line 28 coupled to a DATA CLOCK input terminal of D/A converter 11. After the input data on serial input data signal S12 is accepted, the input data is temporarily stored in a shift register within D/A converter 11. Responsive to a write/read signal S44—i.e., auxiliary function signal S44—on a line 44 coupled to a WRITE/READ input terminal of D/A converter 11, the input data is transferred from the shift register to a random-access memory within D/A converter 11. D/A converter 11 also has an OSCILLATOR input terminal for receiving an external oscillator signal on a line 60 from an external oscillator 62. Line 60 is connected to ground through a resistor R64 which is used to match the output impedance of external oscillator 62. Device output signals S14 are produced on device output lines 14 from D/A converter 11 for evaluating its performance.

D/A converter 11 may be a multi-channel twelve-bit microprocessor-compatible integrated circuit such as that designated by product number $\mu$A9706 and manufactured by Fairchild Camera and Instrument Corporation (Fairchild). The Fairchild $\mu$A9706 has eight output channels on which device output signals S14 are produced and sixty-four different output voltage amplitude levels. Where D/A converter 11 is the Fairchild $\mu$A9706, external oscillator 62 is a conventional oscillator that generates a square-wave signal at an oscillation frequency in the range of 50 kilohertz to 2 megahertz with a low-logic level in the range of 0 to 0.8 volts and a high-logic level in the range of 2.7 to 5.0 volts. Resistor R64 is typically 50 ohms but may differ from this value depending on the output impedance of external oscillator 62.

To test a D/A converter 11 such as the Fairchild $\mu$A9706, multiplexing circuitry 18 receives nine parallel input data signals S16.1, S16.2, S16.3, S16.4, S16.5, S16.6, S16.7, S16.8, and S16.9 (corresponding to signals S16) on lines 16.1, 16.2, 16.3, 16.4, 16.5, 16.6, 16.7, 16.8, and 16.9, respectively. Lines 16.1-16.6 receive six bits of binary input data (with line 16.1 carrying the least significant bit and line 16.6 carrying the most significant bit) to define one of the sixty-four different output levels. Lines 16.7-16.9 receive three bits of binary input data (with line 16.7 carrying the least significant bit and line 16.9 carrying the most significant bit) to select one of the eight output channels. Each parallel input data signal S16.1, . . . or S16.9 is either a binary "0" or a binary "1". Parallel input data signals S16.1, . . . and S16.9 are generated by closing each of double-pole switches 71, 72, 73, 74, 75, 76, 77, 78, and 79, respectively, which are connected to lines 16.1, . . . and 16.9, respectively, between either a line 80 connected to ground to produce a binary "0" at zero volts or a line 81 coupled to a voltage source $V_{CC}$ to produce a binary "1" at the $V_{CC}$ level. A filter capacitor C82 is connected between ground reference and line 81 to reduce variations in the $V_{CC}$ level. In a preferred embodiment, voltage source $V_{CC}$ is 5 volts and capacitor C82 is 1.0 microfarad.

Multiplexing circuitry 18 contains a sixteen-input binary multiplexer 84 connected by lines 16.1, . . . and 16.9 to nine of its sixteen input channels as depicted in FIG. 2a. Lines 17.1, 17.2, 17.3, 17.4, 17.5, 17.6, and 17.7 from the remaining seven input channels are open. Binary multiplexer 84 receives input select signals S20.1, S20.2, S20.3, and S20.4 (corresponding to signals S20) on lines 20.1, 20.2, 20.3, and 20.4, respectively. Responsive to input select signals S20.1, . . . and S20.4, binary multiplexer 84 sequentially selects each of parallel input data signals S16.1, . . . and S16.9 for a time period $t_{PI}$ to produce a complementary serial input data signal on a line 86 from a $\overline{Z}$ complementary data output terminal. Within multiplexing circuitry 18, the complementary serial input data signal on line 86 is inverted by a two-input NAND gate 88, whose input terminals are both connected to line 86, to produce serial input data signal S12.

Multiplexer 84 receives an enable input signal S58—i.e., initializing signal S58—on a line 58 at an $\overline{E}$ complementary enable input terminal. Enable input signal S58 places multiplexer 84 in a condition to accept the binary data bits of parallel input data signals S16.1, . . . and S16.9. Multiplexer 84 is connected to voltage source $V_{CC}$ by a line 90 and is coupled to ground reference through a line 92.

In a preferred embodiment multiplexer 84 is an integrated circuit such as that designated by product number 74150 and made by Fairchild. This device is described in *TTL Data Book*, 1978, pp. 4—192—4—193, issued by Fairchild. The cited pages of the foregoing data book are incorporated by reference herein. With the Fairchild 74150, lines 16.1, . . . and 16.9 connect to pins $I_0$, $I_1$, $I_2$, $I_3$, $I_4$, $I_5$, $I_6$, $I_7$, and $I_8$, respectively, and lines 20.1, . . . and 20.4 connect to pins $S_0$, $S_1$, $S_2$, and $S_3$, respectively.

Oscillator 26 is a conventional time-base oscillator which centers around an S-R flip-flop 94 as shown in FIG. 2b. Flip-flop 94 receives through its $S_I$ input terminal on a line 95 and through its $\overline{R}_I$ complementary input terminal on a line 96 the output signals of a pair of voltage comparators 97 and 98, respectively.

A voltage divider network comprising a resistor R100 to ground from the non-inverting input terminal of comparator 97, a resistor R102 coupled between the non-inverting input terminals of comparators 97 and 98, and a resistor R104 coupled between the non-inverting input terminal of comparator 98 and voltage source $V_{CC}$ establishes the lower and upper voltage operating levels to the non-inverting input terminals of comparators 97 and 98. A filter capacitor C106 to ground is coupled to the non-inverting input terminal of comparator 98 and reduces variations in the voltage operating levels due to perturbations in the $V_{CC}$ level.

Flip-flop 94 has a $\overline{Q}$ complementary output terminal connected by a line 108 to the bases of a pair of substantially identical bipolar NPN transistors T110 and T112 arranged with their emitters grounded in a current-mirror configuration. The collector of transistor T110 is coupled by a line 114 to the inverting input terminals of comparators 97 and 98. The inverting input terminals are further coupled across a resistor R116 to voltage source $V_{CC}$ and to a capacitor C118 to ground.

The oscillation frequency of oscillator 26 is determined primarily by the RC network of resistor R116 and capacitor C118 and corresponds to one RC time constant $t_{RC}$ of the RC network. The voltage at the $\overline{Q}$ complementary output terminal of flip-flop 94 is normally at a low value below the threshold voltage for turning on transistor T110 so that it is normally off. As voltage source $V_{CC}$ charges capacitor C118, the voltage appearing at the inverting input terminals of comparators 97 and 98 rises until their output signals cause flip-flop 94 to change state and provide a high voltage above the threshold voltage for transistor T110 at the $\overline{Q}$ complementary output terminal. Transistor T110 begins to conduct and provides a path to ground through line 114 to discharge capacitor C118 rapidly. The voltage appearing at the inverting input terminals of comparators 97 and 98 then drops rapidly to cause flip-flop 94 to change state again and provide a low voltage at the $\overline{Q}$ complementary output terminal which returns transistor T110 to its normally off state. The oscillation frequency for oscillator 26 is about 20 kilohertz in a preferred embodiment.

The collector of transistor T112 is connected to a line 24/32 which carries oscillator signal S23/32—i.e., both signals S24 and S32 are the same signal S24/32 in this embodiment. The changes in transistor T110 are duplicated in transistor T112 which inverts the $\overline{Q}$ complementary output signal from flip-flop 94. Oscillator signal S24/32 therefore comprises a series of negative-going pulses that drop to binary "0".

Within oscillator 26, control logic circuitry 120 provides a control signal on a line 122 to the $\overline{C}_D$ complementary clear input terminal of flip-flop 94 for placing its $\overline{Q}$ complementary output voltage at the low value. Logic circuitry 120 consists principally of a control flip-flop (which is not illustrated in FIG. 2b) having a TRIGGER input terminal coupled to a line 50/52 and a RESET input terminal coupled to a line 46. Initializing signal S50/52 (i.e., both initializing signals S50 and S52 are the same signal S50/52 in this embodiment) is provided on line 50/52 for initializing oscillator 26 by causing the control signal to be supplied on line 122 to flip-flop 94.

External to oscillator 26 on line 50/52 is a switch 124. Closing switch 124 provides a trigger input signal on line 50/52 to cause oscillator 26 to begin operation.

Digital timing circuitry 22, as depicted in FIG. 2b, utilizes a set of eight negative edge-triggered toggle flip-flops 130, 131, 132, 133, 134, 135, 136, and 137 which each act as divide-by-two counters. Oscillator signal S24/32 is received at the $T_I$ toggle input terminal of flip-flop 130. An output signal from the Q output terminal of flip-flop 130 feeds in on a line 140 to the $T_I$ toggle input terminal of flip-flop 131. Similarly, an output signal from the Q output terminal of each of flip-flops 131–136, respectively, feeds in on a line 141, 142, 143, 144, 145, or 146, respectively, to the $T_I$ toggle input terminal of the next respective flip-flop 132–136 or 137.

Complementary output signals from the $\overline{Q}$ output terminals of flip-flops 130–137 are provided on lines 150, 151, 152, 153, 154, 155, 156, and 157, respectively, to the bases of bipolar NPN transisters T160, T161, T162, T163, T164, T165, T166, and T167, respectively, whose emitters are grounded. The $\overline{Q}$ complementary output signals from flip-flops 130–134, 136, and 137 are inverted by their respective transistors T160,–T164, T166, and T167 at their collectors which are coupled through resistors R170, R171, R172, R173, R174, R176, and R177, respectively, to voltage source $V_{CC}$. The collector of transistor T165 on a line 180 is open.

Input select signals S20.1,–and S20.4 are provided from the collectors of respective transistors T161,–and T164 to multiplexer circuitry 18. Timing signal S40.1 (corresponding to one of signals S40) is supplied on a line 40.1 from the collector of transistor T160 to auxiliary function circuitry 42. Timing signals S36.1/40.2 (i.e., another of signals S36 is the same as one of signals S40) and S36.2.40.3 (i.e., another of signals S36 is the same as another of signals S40) are provided from the collectors of respective transistors T160 and T164 on respective lines 36.1/40.2 and 36.2/40.3 to data clock signal inhibitor 34 and auxiliary function circuitry 42. Timing signal S46 is supplied from the collector of transistor T167 to initializing signal circuitry 48. Signals S182 and S184 are provided on lines 182 and 184, respectively, from the collectors of transistors T166 and T167, respectively.

Timing circuitry 22 includes logic circuitry 120 which provides a control signal on a line 186 to the $\overline{C}_D$ complementary clear input terminals of flip-flops 130–137 to place them in the binary "0" state in response to initializing signal S50/52 at the TRIGGER input terminal. Logic circuitry 120 provides a control signal on a line 188 to the $\overline{S}_D$ complementary set input terminals of flip-flops 130–137 to place them in the binary "1" state in response to timing signal S46.

Timing circuitry 22 further includes a voltage regulating network to supply a regulated voltage $V_R$ on a line 190 to the $V_R$ regulated voltage input terminals of flip-flops 130–137. Regulated voltage $V_R$ is generated through a bipolar NPN transistor T192 having its emitter coupled to line 190 and its collector coupled to voltage source $V_{CC}$. The base of transistor T192 is coupled to a Zener diode D194 to ground and across a resistor R196 to voltage source $V_{CC}$ in order to provide a constant bias voltage equal to the Zener voltage rating of diode D194 at the base of transistor T192. A resistor R198 is further coupled between line 24/32 and the emitter of transistor T192.

In a preferred embodiment, all of the elements of timing circuitry 22 and oscillator 26, except resistors R170,–R174, R176, R177, R116, and R198, capacitors C106 and C118, and voltage source $V_{CC}$ are a programmable timer/counter such as that designated by product number μA2240 and manufactured by Fairchild. This integrated-circuit device is described in *Linear Interface Data Book*, 1978, pp. 9-36—9-47, issued by Fairchild. The cited pages of the foregoing data book are incorporated by reference herein. With the Fairchild μA2240, the collectors of transistors T160,–and T167 connect to pins $O_0$, $O_2$, $O_4$, $O_8$, $O_{16}$, $O_{32}$, $O_{64}$, and $O_{128}$, respectively; capacitor C106 is connected to the modulator input pin; resistor R116 and capacitor C118 connect to the resistor-capacitor input pin; resistor R198 is connected between the time-base output pin and the regulator output pin. Preferably, the resistors and capacitors not integral with the Fairchild A2240 have the following values: resistors R170,–R174, R176, and R177 are each 4.7 kiloohms; resistor R116 is 5 kiloohms; resistor R198 is 20 kiloohms; capacitors C106 and C118 are each 0.01 microfarad.

As shown in FIG. 2b, data clock signal generator 30 contains flip-flop 130, transistor T160, resistor R170, logic circuitry 120, and the $V_R$ voltage regulating network. Data clock signal generator 30 further includes a two-input NAND gate 200 whose two input terminals are both connected to line 40.1. Responsive to oscillator signal S24/32, data clock signal generator 30 produces data clock signal S38 on a line 38 from the output terminal of NAND gate 200. An identical signal S202 is produced on a line 202 coupled to the output terminal of NAND gate 200.

Referring to FIG. 2c, data clock signal inhibitor 34 centers around a two-input AND gate 204 which receives data clock signal S38 at one input terminal. The other input terminal of AND gate 204 receives a signal S206 on a line 206 from the $\overline{Q}_1$ complementary output terminal of a negative edge-triggered J-K flip-flop 208. Data clock signal S28 is generated at the output terminal of AND gate 204 to DUT 10.

Signal S206 also feeds into one input terminal of a two-input NAND gate 210 whose output signal S212 on a line 212 is fed back into the $\overline{S}_{D1}$ complementary set input terminal of flip-flop 208. A binary "0" applied to the $S_{D1}$ complementary set input terminal causes flip-flop 208 to generate a binary "1" at the $Q_1$ output terminal and a binary "0" at the $\overline{Q}_1$ complementary output terminal. The other input terminal of NAND gate 210 receives a signal S214 on a line 214 from the output terminal of a two-input AND gate 216. In turn, AND gate 216 receives timing signals S36.1/40.2 and S36.2/40.3 at its input terminals.

The $J_1$ and $K_1$ input terminals of flip-flop 208 on lines 218 and 220, respectively, are open. A continuous clock input signal from voltage source $V_{CC}$ is provided on a line 222 to the $\overline{CP}_1$ complementary clock input terminal of flip-flop 208.

Flip-flop 208 receives a clear input signal at the $\overline{C}_{D1}$ complementary clear input terminal on a line 224. A binary "0" applied to the $\overline{C}_{D1}$ complementary clear input terminal cause flip-flop 208 to generate a binary "0" at the $Q_1$ output terminal and a binary "1" at the $\overline{Q}_1$ complementary output terminal. Both of the clear and set inputs are clock independent. Initializing signal S54/56 (i.e., both initializing signals S54 and S56 are the same signal S54/56 in this embodiment) is provided on a line 54/56 connected to line 224 for initializing data clock signal inhibitor 34.

Auxiliary function circuitry 42 contains NAND gate 200 (shown in FIG. 2b), flip-flop 208, NAND gate 210, and AND gate 216 (all depicted in FIG. 2c). As illustrated in FIG. 2c, auxiliary function circuitry 42 further includes a two-input AND gate 226 which receives signal S202 at one input terminal and a signal S228 on a line 228 at the other input terminal. In turn, signal S228 is produced on a line 228 from a two-input AND gate 230 which receives a signal S232 at one input terminal on a line 232 from the $Q_1$ output terminal of flip-flop 208 and a signal S234 at the other input terminal on a line 234 from the $\overline{Q}_2$ complementary output terminal of a negative edge-triggered J-K flip-flop 236.

AND gate 226 produces write/read signal S44 for DUT 10 on line 44 which is coupled through a filter capacitor C238 to ground reference. The output terminal of AND gate 226 is further coupled through a line 240 carrying a signal S240 back to the $\overline{CP}_2$ complementary clock input terminal of flip-flop 236. The $J_2$ input terminal of flip-flop 236 receives a constant binary "1" input signal through a line 242 coupled to voltage source $V_{CC}$, while the $K_2$ input terminal of flip-flop 236 receives a constant binary "0" input signal through a line 244 coupled to ground reference. When signal S240 to the $\overline{CP}_2$ complementary clock input terminal drops from a binary "1" to a binary "0", flip-flop 236 generates a binary "1" at the Q$_2$ output terminal on line 58 and a binary "0" at the $\overline{Q}_2$ complementary output terminal. A binary "0" on line 58 acts to disable multiplexer 84.

Flip-flop 236 receives a constant binary "1" from voltage source V$_{CC}$ on a line 246 to the $\overline{S}_{D2}$ complementary set input terminal which is thereby nullified since it requires a binary "0" input signal to cause flip-flop 236 to change state. Flip-flop 236 receives a clear input signal at the $\overline{C}_{D2}$ complementary clear input terminal on a line 248. A binary "0" applied to the $\overline{C}_{D2}$ complementary input terminal causes flip-flop 236 to generate a binary "0" at the Q$_2$ output terminal and a binary "1" at the $\overline{Q}_2$ complementary output terminal. Both of the clear and set inputs are clock independent. Initializing signal S54/56 on line 54/56 which is connected to line 248 initializes auxiliary function circuitry 42 by placing flip-flops 208 and 236 in the binary "0" state.

Initializing signal circuitry 48 contains flip-flops 136 and 137, transistors T166 ad T167, resistors R176 and R177, logic circuitry 120, the V$_R$ voltage regulating circuitry (all shown in FIG. 2b), and flip-flops 208 and 236 (all shown in FIG. 2c). Timing signal S46, which is provided from timing circuitry 22 to the RESET input terminal of logic circuitry 120, causes a binary "1" to be produced on each of lines 182 and 184. Signals S182 and S184 feed into the input terminals of a two-input NAND gate 250 to generate initializing signal S54/56 for initializing data clock signal inhibitor 34 and auxiliary function circuitry 42. Responsive to initializing signal S54/56, flip-flop 208 generates initializing signal S50/52 from the $\overline{Q}_1$ complementary output terminal for initializing timing circuitry 22 and oscillator 26. Similarly, flip-flop 236 generates enable input signal S58 from the Q$_2$ output terminal for enabling (or initializing) multiplexing circuitry 18 in response to initializing signal S50/52.

In a preferred embodiment, flip-flops 208 and 236, in combination, are a dual integrated circuit such as that designated by product number 74H106 and made by Fairchild. This device is described in *TTL Data Book*, 1978, pp. 4-144—4-145, issued by Fairchild. The cited pages of the foregoing data book are incorporated by reference herein. With the Fairchild 74H106, the pins have the same names (except for the numerical subscripts "1" and "2") as described above.

Similarly, in a preferred embodiment, NAND gates 88, 200, 210, and 250, in combination, are a quad integrated circuit such as that designated by product number 7400 and made by Fairchild, and AND gates 204, 216, 226, and 230, in combination, are a quad integrated circuit such as that designated by product number 7408 and manufactured by Fairchild. Preferably, capacitor C238 is 0.01 microfarad.

In fabricating the testing system, the various elements including the discrete resistors and capacitors are mounted on a conventional printed circuit board and interconnected according to conventional semiconductor techniques. Whereas many of the elements of the present testing system have been described as common to two or more of components 18, 22, 26, 30, 34, 42, and 48 shown in FIGS. 2a, 2b, and 2c, the testing system could as well be fabricated with additional elements so that fewer or no elements are in common to two or more of the components.

Some of the elements could be transferred to other components as long as the basic functional relationships are maintained. For example, AND gate 216 could form part of timing circuitry 22 rather than part of data clock signal inhibitor 34 and auxiliary function circuitry 42. Likewise, AND gate 200 could be part of timing circuitry 42. Even further, digital timing circuitry 22 and initializing signal circuitry 48 might be partly or wholly combined to create a composite timing/initializing circuit component.

Figure 3A:
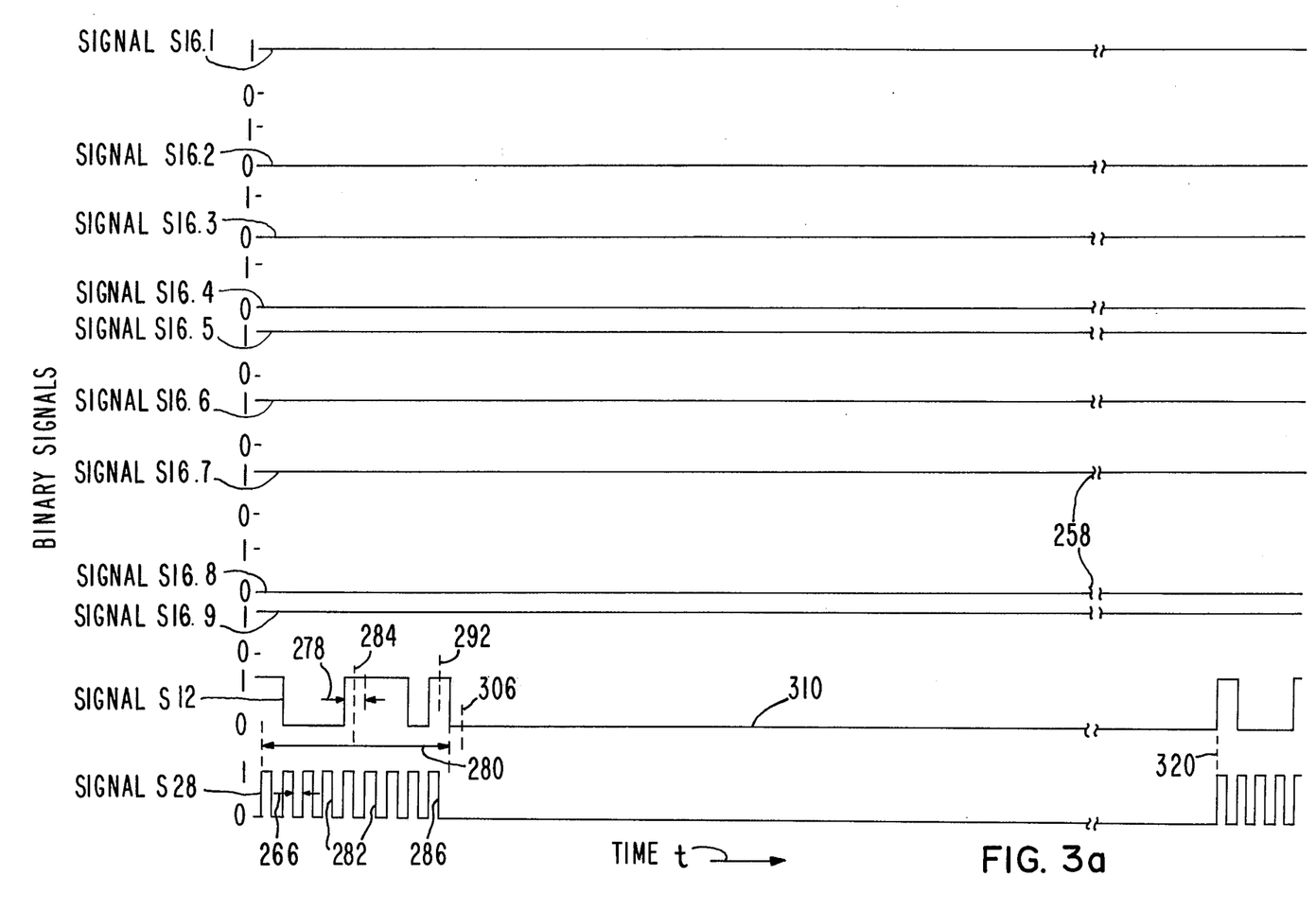
FIGS. 3a, 3b, and 3c are timing diagrams for various signals produced in the embodiment of FIGS. 2a, 2b, and 2c.
Figure 3B:
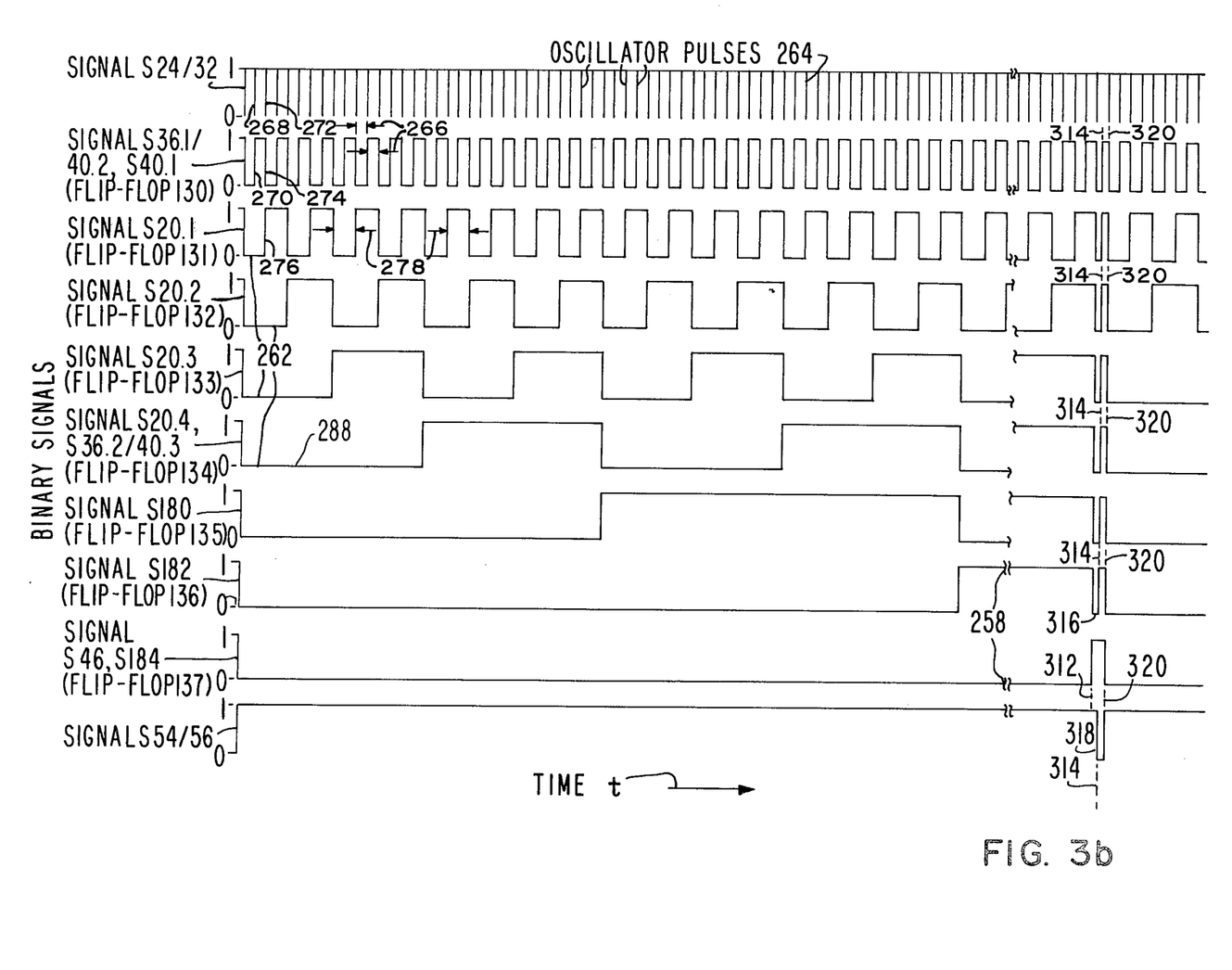
Figure 3C:
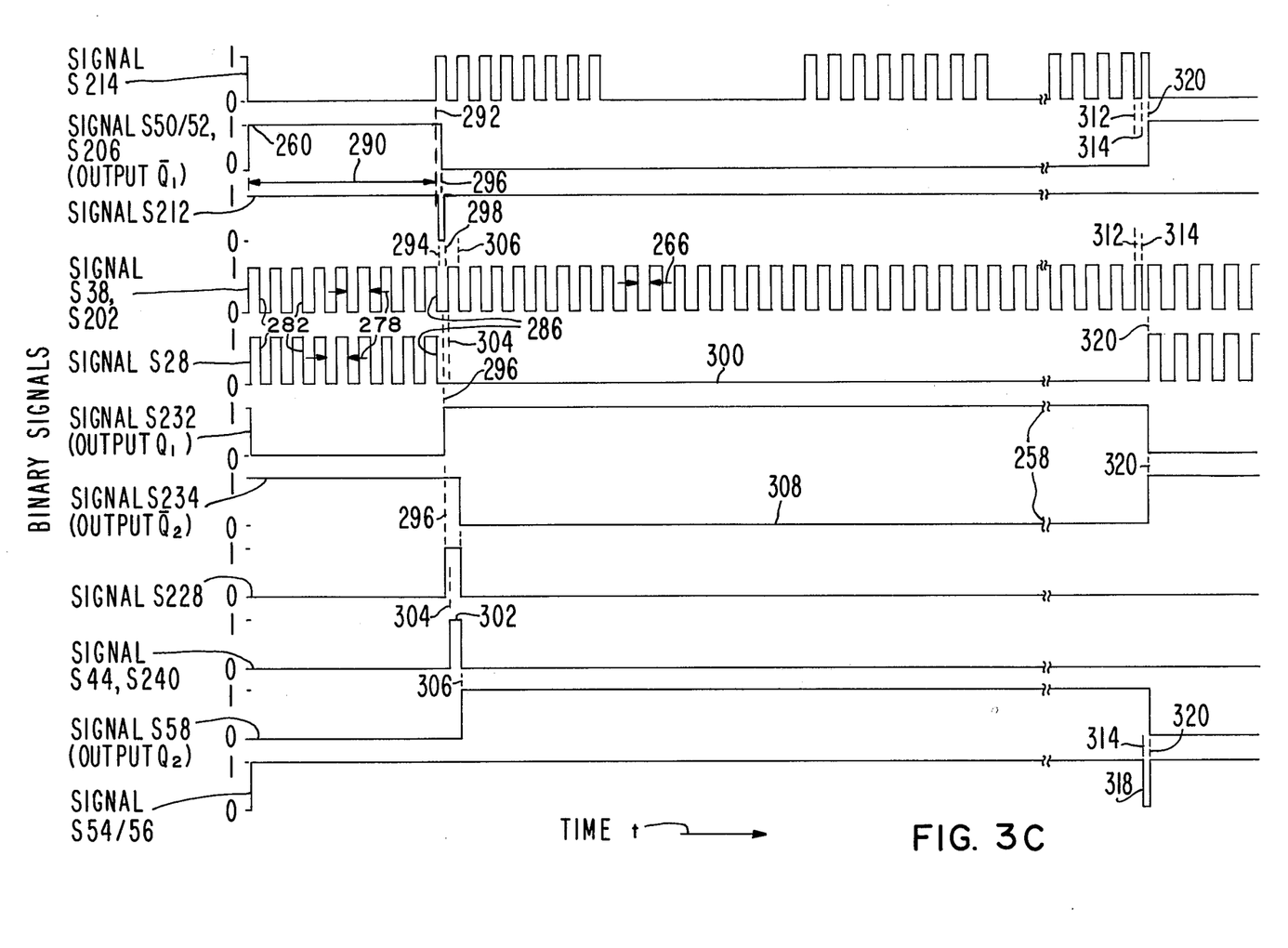

FIGS. 3a, 3b, and 3c illustrate timing diagrams useful in understanding operation of the testing system described above and depicted in FIGS. 2a, 2b, and 2c. FIG. 3a generally shows examples of parallel input data signals S16.1,-and S16.9 and serial input data signal S12. FIG. 3b generally illustrates the signals from the collectors of transistors T160,-and T167, including input select signals S20.1,-and S20.4. FIG. 3c generally shows various timing and initializing signals. A jump im time occurs at points 258 in all of the signals shown in FIGS. 3a, 3b, and 3c.

As a testing sequence begins, parallel input data signals S16.1,-and S16.9 are at a desired combination of binary "0's" and "1's". In the example of FIG. 3a, parallel input data signals S16.1,-and S16.9 represent the binary code "100011101".

To start the testing sequence, switch 124 is closed to provide a binary "1" on line 50/52, as indicated at 260 in FIG. 3c, to the TRIGGER input terminal of logic circuitry 120. This trigger input signal activates oscillator 26 and sets flip-flops 130-137 in the binary "0" state as shown at 262 in FIG. 3b for signals S20.1,-and S20.4. Oscillator 26 generates narrow negative-going oscillator pulses 264 having a repetition period $t_{RC}$ indicated at 266. In a preferred embodiment, time period 266 ($t_{RC}$) is about 50 microseconds while the width of oscillator pulses 264 is about 500 nanoseconds.

Each of flip-flops 130-137 changes state—i.e., goes from a binary "0" to a binary "1" or vice versa—when the respective T$_I$ toggle input signal goes negative—i.e., switches from a binary "1" to a binary "0". To facilitate the discussion, the collector of transistor T165 is treated as supplying a signal S180 on line 180. The collector signal from each of transistors T160,-and T167 is binarily equivalent to the state of the corresponding flip-flop 130,-or 137, respectively. The T$_I$ toggle input signal to flip-flop 130 is signal S24/32, and the T$_I$ toggle input signal to each of flip-flops 131-137 is binarily equivalent to the state of the respective prior flip-flop 130-135 or 136.

In particular, coincident with the first negative-going oscillator pulse 268 after the trigger input signal, flip-flop 130 (as represented by timing signal S36.1/40.2) rises to a binary "1" as shown at 270 in FIG. 3b. On the next oscillator pulse 272 flip-flop 130 drops back to binary "0" as indicated at 274. As flip-flop 130 returns to binary "0", flip-flop 131 rises to a binary "1" as shown at 276. This form of operation continues until the testing system is initialized. Each flip-flop 131-136 or 137 changes state at a time interval which is twice the time interval at which the respective previous flip-flop 130-135 or 136 changes state.

The time period 278 between consecutive changes of state of flip-flop 131 is the basic time interval $t_{PI}$ for serial input data signal S12 as indicated in FIG. 3a. Time period 278 is twice time period 266 ($t_{RC}$) and is the basic repetition period for the data clock pulses as indicated in FIG. 3c.

Multiplexing circuitry 18 sequentially selects each of parallel input data signals S16.1,-and S16.9 for time period 278. Inasmuch as there are nine parallel input data signals S16.1,-and S16.9, they are all selected once each in a composite time interval 280 equal to nine time intervals 278. After time interval 280, multiplexer circuitry 18 is disabled and serial input data signal S12 stays at binary "0" until the testing system is initialized. Parallel input data signals S16.1,-and S16.9 may be changed after time interval 280. Alternatively, the pattern of binary "0's" and "1's" in time interval 280 of serial input data signal S12 could be repeated one or more times.

Where DUT 10 accepts serial input data only on certain edges of the pulses forming data clock signal S28—for example, on the negative-going edges 282 in the case of the Fairchild $\mu$A9706—the data clock pulses are so arranged in time that the edges at which data is accepted do not occur during either the high-to-low or low-to-high transitions in serial input data signal S12 to avoid introducing errors into the data. Preferably, the edges of the data clock pulses at which DUT 10 accepts serial input data occur approximately during the middles of each time interval 278 as indicated at 284. To produce an appropriate data clock signal which has negative-going edges during the middle of each time interval 278, signal S40.1 which has the necessary repetition period but has positive-going transitions in the middle of each time-interval 278 is inverted by NAND gate 200 to produce data clock signal S38 having the requisite transitional characteristics.

In a preferred embodiment, the data clock pulses are inhibited immediately after the ninth negative-going transition 286 of the data clock pulses—i.e., immediately after the last bit of binary data on serial input data signal S12 has been transferred into DUT 10. To so inhibit the data clock pulses, timing signal S36.2/40.3, which is at binary "0" during the first eight time intervals 278 as indicated at 288, and timing signal S36.1/40.2 feed into AND gate 216 to produce signal S214, which is at binary "0" as indicated at 290 in FIG. 3c until the time 292 at which the last bit of binary data on serial input data signal S12 is being transferred into DUT 10. During time interval 290, flip-flop 208 is in the binary "0" state with signal S206 from the $\overline{Q}_1$ complementary output terminal into NAND gate 210 and signal S212 from NAND gate 210 both at binary "1". Signal S214 from AND gate 216 rises to binary "1" at time 292 causing NAND gate 210 to generate a binary "0" on line 212 about 10-25 nanoseconds thereafter at time 294. This binary "0" on line 212 to the $\overline{S}_{D1}$ complementary set input terminal causes flip-flop 208 to change state another 10-35 nanoseconds later, and signal S206 into NAND gate 210 and AND gate 204 drops to a binary "0" at time 296. Signal S212 from AND gate 210 returns to its initial status at binary "1" another 10-25 nanoseconds later at time 298. The negative-going transition in signal S206 at time 296 therefore occurs about 20-60 nanoseconds (corresponding to signal transit time through NAND gate 210 and flip-flop 208) after data transfer into DUT 10 is completed at time 292. AND gate 204 then receives data clock signal S38 and signal S206 to inhibit the data clock pulses in data clock signal S28 after time 296 as indicated at 300.

To inhibit the data clock pulses at another time, another suitable combination of timing signals are taken from the collectors of appropriate ones of transistors T160, . . . and T167. For example, timing signals from the collectors of transistors T130, T133, T135, and T136 could be combined through a suitable AND gate to generate signal S214 for inhibiting the data clock pulses after the fifty-third high-to-low transition.

Write/read signal S44 comprises a single positive-going pulse 302 produced shortly after time 296 when all the data on serial input data signal S12 is loaded into DUT 10. Prior to time 296, flip-flop 236 is at binary "0" with signal S234 from the $\overline{Q}_2$ complementary output terminal into AND gate 230 at binary "1". Similarly, signal S232, which is the inverse of signal S206 and feeds into AND gate 230, is a binary "0", so that signal S228 from AND gate 230 into AND gate 226 and write/read signal S44 from AND gate 226 are both at binary "0". When signal S232 rises to binary "1" at time 296, signal S228 also rises to binary "1", but write/read signal S44 remains at binary "0" because signal S202 into AND gate 226 is temporarily at binary "0". As signal S202 switches to binary "1" at time 304 which occurs when the ninth negative-going data clock pulse ends, write/read signal S44 rises to binary "1". At time 306 which occurs about a time interval 278 after time 304, signal S202 drops to binary "0", causing write/read signal S44 to return to binary "0" to complete pulse 302.

The high-to-low transition at time 306 of signal S240, which is the equivalent of write/read signal S44 and feeds into the $\overline{CP}_2$ complementary clock input terminal, causes flip-flop 236 to go to a binary "1" state; signal S234 from the $\overline{Q}_2$ complementary output terminal thereby drops to a binary "0" and remains at that level, as indicated at 308, to prevent any more write/read pulses from being generated until after the testing system is initialized. The events described as occurring at time 306 actually occur over a period of 30-80 nanoseconds which is quite small compared to time period 266 or 278.

Additionally, signal S58 from the $Q_2$ output terminal of flip-flop 236 to the $\overline{E}$ complementary enable terminal of multiplexer 84 rises to a binary "1" at time 306 to disable multiplexer 84. Thereafter, serial input data signal S12 remains at binary "0" as indicated at 310 in FIG. 3a. Disabling multiplexer 84 serves to prevent undesired data from entering DUT 10 due to noise occurring after time 306 at the DATA CLOCK input terminal of DUT 10.

The testing system is initialized to provide a new serial input data signal S12 at a selected time after the testing system has completed its other operations. In a preferred embodiment, the initialization procedure begins after sixty-four time intervals 278. At this time, as indicated at 312 in FIG. 3b, flip-flop 137 first reaches a binary "1". Timing signal S46 then provides a binary "1" to the RESET input terminal of logic circuitry 120 which generates a control signal on line 188 that causes all of flip-flops 130-137 to be set in the binary "1" state shortly thereafter at time 314. Just prior to time 314, flip-flop 136 is in a binary "0" state as indicated at 316, having shifted to the binary "0" state at time 312. For the first time at time 314, signals S182 and S184 into NAND gate 250 are at binary "1" at the same time, causing initializing signal S54/56 from NAND gate 250 to drop from a binary "1" to a binary "0" as indicated at 318.

The binary "0" on line 54/56 feeds through lines 224 and 248 into the $\overline{C}_{D1}$ and $\overline{C}_{D2}$ complementary clear input terminals of flip-flops 208 and 236, respectively, to return them to the binary "0" state and thereby to initialize data clock signal inhibitor 34 and auxiliary function circuitry 42. Accordingly, write/read enable signal S58 from the $Q_2$ output terminal of flip-flop 236 to the $\overline{E}$ complementary enable input terminal of multiplexer 84 drops to a binary "0" which reenables multiplexing circuitry 18. Similarly, initializing signal S50/52 from the $\overline{Q}_1$ complementary output terminal of flip-flop 208 to the TRIGGER input terminal of logic circuitry 120 rises to binary "1" which causes logic circuitry 120 to restart oscillator 26 and to generate a control signal on line 186 to return flip-flops 130–137 to the binary "0" state, thereby initializing timing circuitry 22. As signals S182 and S184 into NAND gate 250 return to binary "0", initializing signal S54/56 from NAND gate 250 also returns to binary "0". All of these initializing events occur within several hundred nanoseconds (corresponding to the signal transit time through logic circuitry 120, flip-flop 136 or 137, NAND gate 250, flip-flop 208, logic circuitry 120 again, and flip-flop 136 or 137 again) after time 314 as indicated at 320.

As with the data clock pulses, the time at which the testing system is initialized can be varied by generating timing signal(s) S46 from the collectors of other appropriate transistors T160, . . . and T167 and using other suitable gates as necessary.

While the invention has been described with reference to particular embodiments, the description is solely for the purpose of illustration and is not to be construed as limiting the scope of the invention claimed below. For example, a testing system that generates a serial input data signal formed from more than sixteen parallel input data signals could be produced by employing two or more programmable timers of the type described above. The repetition period for the data clock pulses may be a multiple greater than two of, or otherwise differ from, the repetition period of the oscillator pulses. Thus, various modifications, changes, and applications may be made by those skilled in the art without departing from the true scope and spirit of the invention as defined by the appended claims.

What is claimed is:

1. An electronic system for testing an electronic device responsive to a data clock signal and to a serial input data signal synchronous with the data clock signal, said system comprising:
    oscillating means for repetitively generating oscillator pulses at a first selected repetition period;
    data clock signal generating means responsive to the oscillator pulses for producing the data clock signal which comprises a series of data clock pulses at a second selected repetition period;
    timing means for counting the oscillator pulses and for generating at least two input select signals indicative of the number of oscillator pulses counted, each input select signal being generated on a separate input select line; and
    multiplexing means for receiving at least two parallel input data signals and for sequentially selecting each of the parallel input data signals in response to the input select signals provided thereto on the input select lines to generate the serial input data signal.

2. An electronic system as in claim 1 and further including data clock signal inhibiting means for inhibiting the data clock signal after said multiplexing means has selected each of the parallel input data signals a specified number of times.

3. An electronic system as in claim 2 wherein said timing means generates a first timing signal when said timing means has counted a first selected number of oscillator pulses and wherein said data clock signal inhibiting means inhibit the data clock signal in response to the first timing signal.

4. An electronic system for testing an electronic device responsive to a data clock signal, a serial input data signal synchronous with the data clock signal, and an auxiliary signal for initiating an auxiliary function in said device, said system comprising:
    oscillating means for repetitively generating oscillator pulses at a first selected repetition period;
    data clock signal generating means responsive to the oscillator pulses for producing the data clock signal comprising a series of data clock pulses at a second selected repetition period;
    timing means for counting the oscillator pulses, for generating at least one input select signal indicative of the number of oscillator pulses counted, for generating a first timing signal upon counting a first selected number of oscillator pulses, and for generating a second timing signal upon counting a second selected number of oscillator pulses;
    multiplexing means for receiving at least two parallel input data signals and for sequentially selecting each of the parallel input data signals in response to the at least one input select signal to generate the serial input data signal;
    data clock signal inhibiting means responsive to the first timing signal for inhibiting the data clock signal after said multiplexing means has selected each of the parallel input data signals a specified number of times; and
    auxiliary means responsive to the second timing signal for generating the auxiliary signal.

5. An electronic system as in claim 4 wherein said timing means generates a third timing signal when said timing means has counted a third selected number of oscillator pulses, wherein said timing means is initialized in response to a first initializing signal, wherein said data clock signal inhibiting means is initialized in response to a second initializing signal, and further including initializing signal means responsive to the third timing signal for generating the initializing signals.

6. An electronic system as in claim 5 wherein said initializing signal means further generates a third initializing signal for initializing said auxiliary means.

7. An electronic system as in claim 6 wherein said initializing signal means further generates a fourth initializing signal for initializing said multiplexing means.

8. An electronic system as in claim 1 or 4 wherein each parallel input data signal is selectively either a binary low logic level or a binary high logic level and wherein the serial input data signal comprises the logic levels of the parallel input data signals arranged sequentially in time at the second selected repetition period.

9. An electronic system as in claim 8 wherein the selected repetition periods are different from each other.

* * * * *